United States Patent
Cho

(10) Patent No.: US 8,946,796 B2
(45) Date of Patent: Feb. 3, 2015

(54) IMAGE SENSOR

(71) Applicant: Dongbu HiTek Co., Ltd., Gyeonggi-do (KR)

(72) Inventor: Jin Youn Cho, Gyeonggi-do (KR)

(73) Assignee: Dongbu HiTek Co., Ltd. (KR)

( * ) Notice: Subject to any disclaimer, the term of this patent is extended or adjusted under 35 U.S.C. 154(b) by 12 days.

(21) Appl. No.: 13/751,421

(22) Filed: Jan. 28, 2013

(65) Prior Publication Data

US 2013/0299935 A1    Nov. 14, 2013

(30) Foreign Application Priority Data

May 14, 2012   (KR) .................. 10-2012-0050891

(51) Int. Cl.
*H01L 31/113*    (2006.01)

(52) U.S. Cl.
USPC ............... 257/292; 257/59; 257/73; 257/446

(58) Field of Classification Search
USPC ............... 257/59, 73, 290–292, 432, 438, 257/446–447; 438/70–73, 144, 710
See application file for complete search history.

(56) References Cited

U.S. PATENT DOCUMENTS

| | | | |
|---|---|---|---|
| 7,838,956 B2 * | 11/2010 | McCarten et al. | 257/447 |
| 2008/0102557 A1 | 5/2008 | Kim et al. | |
| 2009/0146148 A1 | 6/2009 | Pyo | |
| 2009/0243021 A1 | 10/2009 | Cole et al. | |
| 2009/0261441 A1 * | 10/2009 | Yasukawa et al. | 257/438 |
| 2010/0155797 A1 | 6/2010 | Lee et al. | |

FOREIGN PATENT DOCUMENTS

| | | |
|---|---|---|
| KR | 10-2007-0034883 | 3/2007 |
| KR | 10-0801053 | 1/2008 |
| KR | 10-2009-0058761 | 6/2009 |
| KR | 10-2010-0074966 | 7/2010 |

* cited by examiner

*Primary Examiner* — Dung A. Le
(74) *Attorney, Agent, or Firm* — Andrew D. Fortney; Central California IP Group, P.C.

(57) ABSTRACT

An image sensor may include at least one device isolation layer that passes through an epitaxial layer in a semiconductor substrate to isolate pixel regions, a light-receiving element in each pixel region, and a transistor in the active region of the semiconductor substrate partitioned by the device isolation layer.

20 Claims, 4 Drawing Sheets

IMAGE SENSOR

Figure 1A:
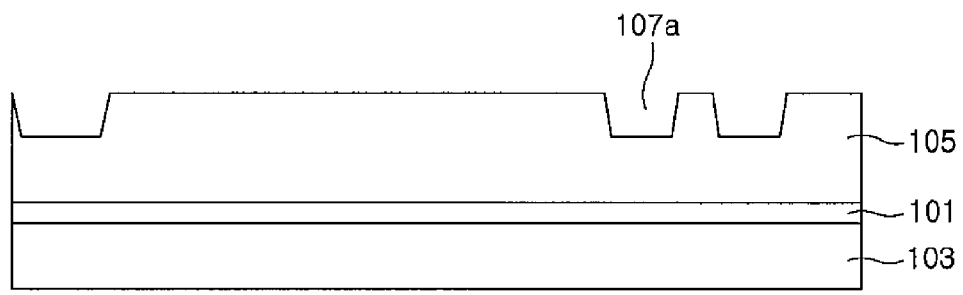

The present application claims priority to Korean Patent Application No. 10-2012-0050891 (filed on May 14, 2012), which is hereby incorporated by reference in its entirety.

BACKGROUND

Light generated or reflected from objects existing in nature may have an associated inherent value in wavelength or range of wavelengths or similar measurement. An image sensor may be a device that takes the images of objects. Some image sensors may implement semiconductor devices that react with external energy (e.g. light) to generate reproducible electrical signals. Particularly, pixels of the image sensor may sense the light generated from objects and convert the sensed light into electric signals or values.

Two types of semiconductor image sensors are CCDs (Charge Coupled Devices) based on a silicon semiconductor substrate and a CMOS image sensor manufactured by sub-micro CMOS (Complementary Metal Oxide Semiconductor) processing technology.

A CCD is a device in which MOS capacitors may be positioned very close to each other and charge carriers may be stored and carried to capacitors. CCDs may be driven in a relatively complicated manner and may consume a relatively high amount of power, among other potential limitations. Formation of a CCD may require a relatively large number of steps using a mask processes. Accordingly, it may be relatively difficult to implement a signal processing circuit in a CCD chip as compared to a CMOS image sensor (e.g. the ability to remove or minimize defects).

A CMOS image sensor may have a PD (Photo Diode) and a MOS transistor in unit cells and may implement an image by detecting signals in a switching method. A CMOS image sensor may have a relatively low manufacturing cost and power consumption compared to a CCD and may be relatively easily integrated with a peripheral chip. As described above, a CMOS image sensor may be manufactured by CMOS technology, such that it may be easily integrated with a peripheral system for amplifying and processing a signal. Therefore, it may be possible to minimize the manufacturing cost by implementation of CMOS image sensors. Further, the processing speed of a CMOS image sensor may be relatively high and the power consumption may be relatively low compared to a CCD image sensor (e.g. about 1% of the power consumption of a CCD in some applications).

An image sensor may be formed by ion-injecting photo diodes into a semiconductor substrate. The size of the photo diodes may be minimized to maximize the number of pixels in a unit area without increasing the chip size and the overall area of a photodetection unit may be minimized. However, a stack height (e.g. thickness) may not easily be minimized, which may present challenges in producing and designing a backside-illuminated image sensor (e.g. ability to minimize the step at the upper portion of the illumination unit and/or minimize interference with light due to metal routing).

In the backside-illuminated image sensor of the related art, when electrons generated by irradiated light are collected to corresponding pixels, accurate light reception characteristics may be exhibited. However, since there is no layer or structure which is able to isolate electrons generated by light irradiated on the back side between pixels, electrons may be unintentionally transferred between adjacent pixels, which may result in undesirable crosstalk.

SUMMARY

Embodiments relate to an image sensor including a device isolation layer, which substantially isolates adjacent pixels in a semiconductor substrate to prevent or minimize crosstalk. Embodiments relate to a method for manufacturing the same. Embodiments may allow a device isolation layer to be used as an alignment key during grinding of a semiconductor substrate in a backside-illuminated image sensor, while substantially preventing crosstalk between pixels.

Embodiments relate to a method for manufacturing an image sensor including at least one of: (1) forming at least one device isolation layer which is formed to pass through an epitaxial layer in a semiconductor substrate to isolate pixel regions; (2) forming a light-receiving element in each pixel regions; and/or (3) forming a transistor in the active region of the semiconductor substrate partitioned by the device isolation layer.

The forming of at least one device isolation layer may be performed such that the device isolation layer is formed to pass through a buried insulating layer formed in the semiconductor substrate, in accordance with embodiments. In embodiments, the forming of the at least one device isolation layer may include at least one of: (1) removing the epitaxial layer at a preset depth to form a first type trench; (2) removing the epitaxial layer up to the end of the epitaxial layer to form a second type trench; and/or (3) filling the first type trench and the second type trench with an insulating material to form a first type device isolation layer and a second type device isolation layer.

In embodiments, the forming of the first type trench and the second type trench may include at least one of: (1) forming a plurality of first type trenches; and (2) removing the epitaxial layer such that at least one of the plurality of first type trenches is deeper (e.g. in order to form the second type trench).

In embodiments, a method may include at least one of: (1) bonding a support substrate on the front surface of the semiconductor substrate in which the transistors are formed; and/or (2) grinding the back side of the semiconductor substrate using the device isolation layer formed to pass through the epitaxial layer as an alignment key.

In accordance with embodiments, an image sensor may include at least one of: (1) at least one device isolation layer configured to be formed to pass through an epitaxial layer in a semiconductor substrate; (2) a light-receiving element formed in each pixel region; and/or (3) a transistor formed in the active region of the semiconductor substrate partitioned by the device isolation layer.

In embodiments, an image sensor may include at least one of: (1) a buried insulating layer configured to be formed in the semiconductor substrate; and/or (2) a device isolation layer formed to pass through the buried insulating layer. In embodiments, all or some of the device isolation layers may be formed to pass through the epitaxial layer.

In embodiments, a device isolation layer may include a first type device isolation layer formed by filling a first type trench. The first type device isolation layer may be formed by removing the epitaxial layer to a preset depth and depositing an insulating material in the first type trench. In embodiments, a device isolation layer may include a second type device isolation layer formed by filling a second type trench (which may be formed by removing the epitaxial layer all the way through the epitaxial layer) with an insulating material.

In embodiments, a device isolation layer may be formed to completely or substantially isolate adjacent pixels in a semiconductor substrate to prevent crosstalk between the pixels. A device isolation layer may be formed to pass through the epitaxial layer and thus may be used as an alignment key during grinding on the back side of a semiconductor substrate when manufacturing a backside-illuminated image sensor.

DRAWINGS

Figure 1B:
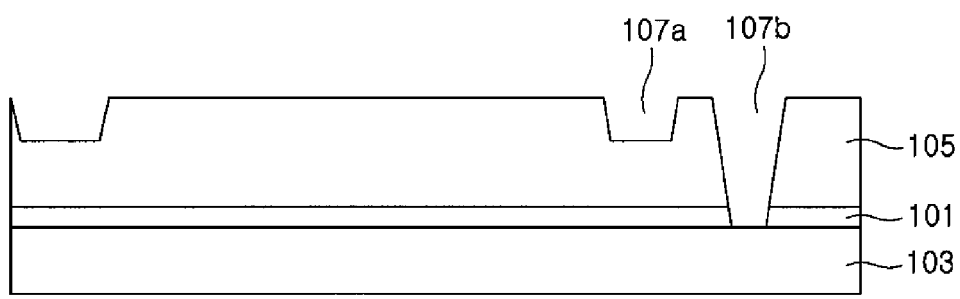
Figure 1C:
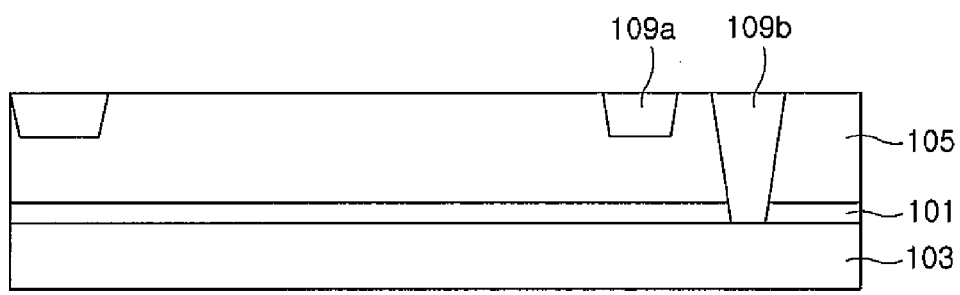

The above and other features of embodiments will become apparent from the following description of embodiments given in conjunction with the accompanying drawings, in which:

Example FIGS. 1A to 1C are cross sectional views illustrating a device isolation layer, in accordance with embodiments.

Figure 2A:
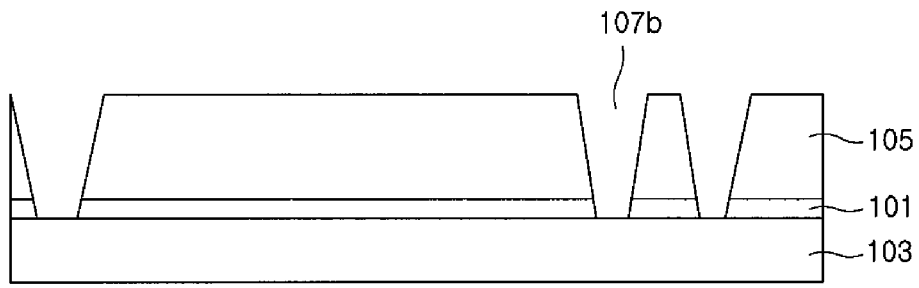
Figure 2B:
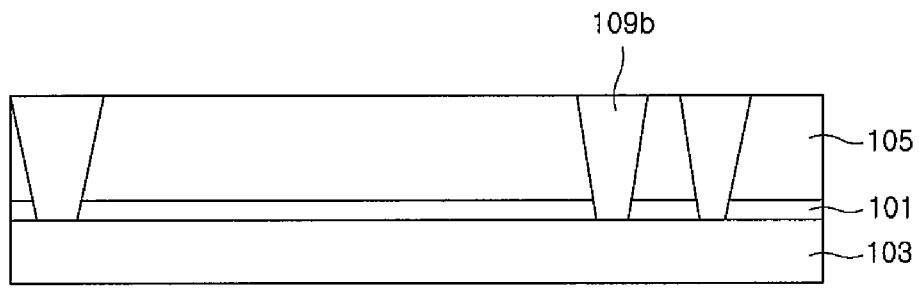

Example FIGS. 2A and 2B are cross sectional views illustrating a process of forming a device isolation layer, in accordance with embodiments.

Example FIGS. 3 to 6 are cross sectional views illustrating a method for manufacturing a backside-illuminated image sensor including an device isolation layer, in accordance with embodiments.

DESCRIPTION

Advantages and features of embodiments and methods of accomplishing the same may be understood more readily by reference to the following detailed description of embodiments and the accompanying drawings. Embodiments may, however, be embodied in many different forms and should not be construed as being limited to the embodiments set forth herein. Rather, these embodiments are provided so that this disclosure will be thorough and complete and will fully convey the concept of the embodiments to those skilled in the art, and the embodiments should only be defined by the appended claims.

An image sensor and a method for manufacturing the same according to embodiments may be applied not only to backside-illuminated image sensors (and methods for manufacturing the same), but also to front side-illuminated image sensors (and methods for manufacturing the same). Accordingly, although some embodiments described below are orientated to backside-illuminated image sensor (and methods for manufacturing the same), these embodiments are not necessarily limited to backside illuminated image sensors.

Example FIGS. 1A to 1C are cross sectional views illustrating a device isolation layer, in accordance with embodiments. Example FIGS. 2A and 2B are cross sectional views illustrating a process for forming a device isolation layer, in accordance with embodiments. Example FIGS. 3 to 6 are cross sectional views illustrating a method for manufacturing a backside-illuminated image sensor including a device isolation layer, in accordance with embodiments.

Figure 6:
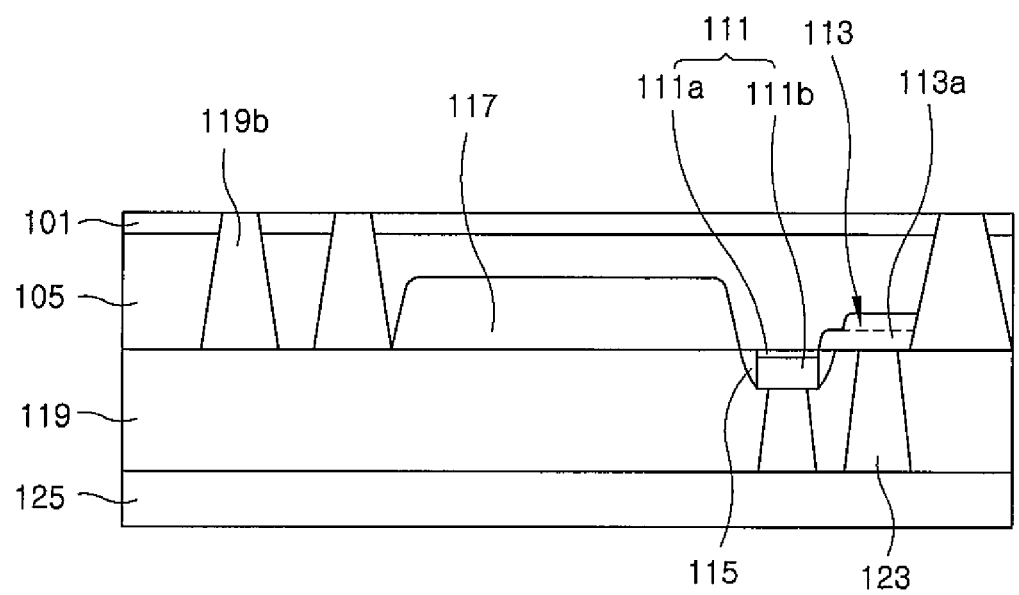

An example configuration of an image sensor (in accordance with embodiments) is described with reference to FIGS. 1C, 3, and 6. As shown in example FIG. 3, an image sensor (in accordance with embodiments) includes at least one second type device isolation layer 109b. Device isolation layer 109b may be formed to pass through an epitaxial layer 105 in a semiconductor substrate 103 to isolate at least one of pixel regions, a light-receiving element (e.g. a photodiode 117, which is formed in each pixel region), a gate electrode 111, and a source/drain region 113 which may be formed in the active region of the semiconductor substrate 103 partitioned by the second type device isolation layer 109b to form a transistor. When a buried insulating layer 101 is formed in the semiconductor substrate 103, the second type device isolation layer 109b may be formed to pass through the buried insulating layer 101.

Figure 3:
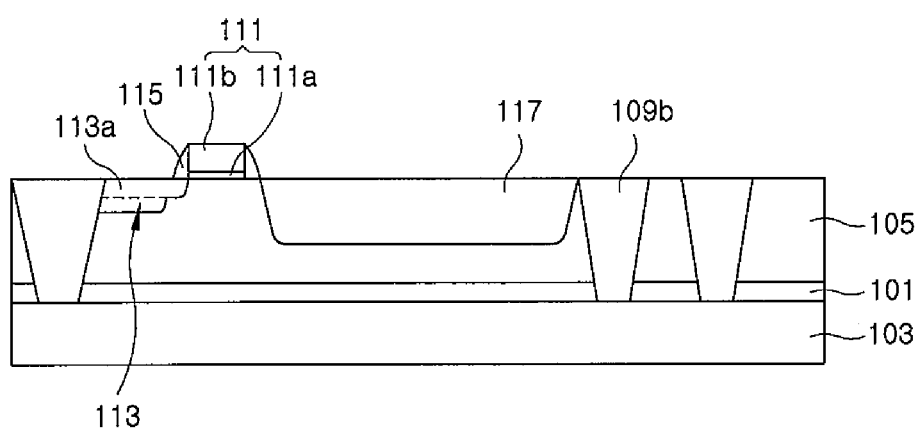

In an image sensor illustrated in FIG. 3, all or some of the device isolation layers for isolating the pixel regions may be formed of the second type device isolation layer 109b, in accordance with embodiments. As illustrated in FIG. 1C, a first type device isolation layer 109a which may be formed to a preset depth instead of passing through the epitaxial layer 105 may be mixed along with the second type device isolation layer 109b.

One configuration of an image sensor (according to embodiments) may be applied to both a front side-illuminated image sensor and a backside-illuminated image sensor. FIG. 6 illustrates an example where the configuration of the image sensor (according to embodiments) is applied to a backside-illuminated image sensor.

A method for manufacturing a backside-illuminated image sensor in accordance with embodiments is described with reference to FIGS. 1A to 1C, 2A to 2B, and 3 to 6. As illustrated in example FIG. 1A, a first conduction-type epitaxial layer 105 may be formed on the front side of the semiconductor substrate 103 using a silicon growth method which may include epitaxial growth and annealing. The epitaxial layer 105 may be removed to a preset depth to form first type trenches 107a in the semiconductor substrate 103 in which the epitaxial layer 105 may be formed. A buried insulating layer 101 may be formed of a silicon oxide film ($SiO_2$) or similar material in the semiconductor substrate 103, in accordance with embodiments.

As illustrated in FIG. 1B, the epitaxial layer 105 may be removed such that at least two first type trenches 107a are formed, where at least one of the first type trenches 107a is the beginning formation of a deeper second type trench 107b (illustrated in FIG. 1B). As illustrated in FIG. 1B, when the buried insulating layer 101 is formed in the semiconductor substrate 103, the second type trench 107b is formed to pass through the buried insulating layer 101 and the epitaxial layer 105. When the buried insulating layer 101 is not formed (in embodiments), the second type trench 107b may be formed to only pass through the epitaxial layer 105. As illustrated in example FIG. 1C, the first type trench 107a and the second type trench 107b may be filled with an insulating material to form a first type device isolation layer 109a and a second type device isolation layer 109b, in accordance with embodiments. As illustrated in FIG. 1C, when the buried insulating layer 101 is formed in the semiconductor substrate 103, the second type device isolation layer 109b may be formed to pass through the buried insulating layer 101, in accordance with embodiments.

In accordance with embodiments, as illustrated in FIG. 1C, the first type device isolation layer 109a and the second type device isolation layer 109b may be mixed together. According to embodiments, as illustrated in FIG. 2B, only the second device isolation layers 109b may be provided.

As illustrated in example FIG. 2A, a first conduction-type epitaxial layer 105 may be formed on the front side of the semiconductor substrate 103 using a silicon growth method including epitaxial growth and annealing, in accordance with embodiments. In embodiments, a second trenches 107b may be formed by removing the epitaxial layer 105 up to the end of the epitaxial layer 105 in the semiconductor substrate 103 in which the epitaxial layer 105 is formed. As illustrated in FIG. 2A, when a buried insulating layer 101 is formed in the semiconductor substrate 103, the second trenches 107b may be formed to pass through the buried insulating layer 101, in accordance with embodiments.

As illustrated in example FIG. 2B, the second type trenches 107b may be filled with an insulating material to form second type device isolation layers 109b, in accordance with embodiments. As illustrated in FIG. 2B, when the buried insulating layer 101 is formed in the semiconductor substrate 103, the second type device isolation layers 109b may be formed to pass through the buried insulating layer 101, in accordance with embodiments.

A subsequent process on the semiconductor substrate 103 in which, as shown in FIG. 2B, no first type device isolation layer 109a is provided, and only the second type device isolation layers 109b are provided will be described, in accordance with embodiments.

As illustrated in example FIG. 3, a gate insulating film 111a and a gate conductive film 111b may be formed on the semiconductor substrate 103 and etched to form a gate electrode 111.

In embodiments, a second conduction-type LDD (Lightly Doped Drain) region 113a may be formed in the semiconductor substrate 103 exposed on the side where the gate electrode 111, spacers 115 formed at both sidewalls of the gate electrode 111, and/or a photodiode 117 are formed. A second condition-type heavily doped source/drain region 113 may be formed in the semiconductor substrate 103 on the side of the spacer 115. In embodiments, the source/drain region 113 may be formed with a concentration higher than the LDD region 113a.

Figure 4:
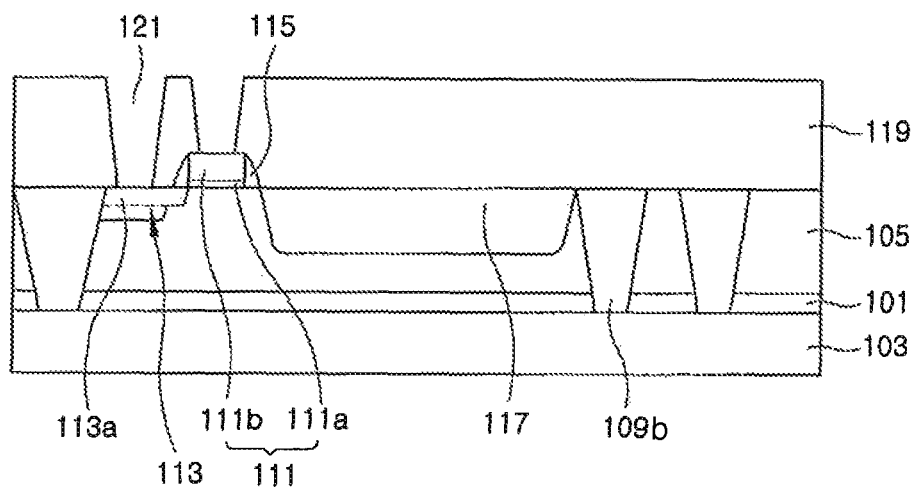

As illustrated in example FIG. 4, an insulating interlayer 119 may be formed to cover or substantially cover the semiconductor substrate 103 including the gate electrode 111, the spacers 115, the photodiode 117, and/or the source/drain region 113. In embodiments, the insulating interlayer 119 may be formed of an oxide film (e.g. a silicon oxide film). In embodiments, the oxide film may include at least one of BPSG (BoroPhosphoSilicate Glass), PSG (PhosphoSilicate Glass), BSG (BoroSilicate Glass), USG (Un-doped Silicate Glass), and TEOS (Tetra Ethyl Ortho Silicate), and/or a deposited film thereof. In embodiments, the insulating interlayer 119 may be formed of a film (e.g. such as a SOD (Spin On Dielectric) film), which is coated using spin coating.

Local etching may be performed on the entire surface of the semiconductor substrate 103, on which the insulating interlayer 119 is formed, to form contact holes 121 which may pass through the insulating interlayer 119 to expose the gate electrode 111 or the source/drain region 113, in accordance with embodiments. In embodiments, etching for forming the contact holes 121 may include dry etching and/or wet etching. Dry etching may be performed to form a vertical profile.

Figure 5:
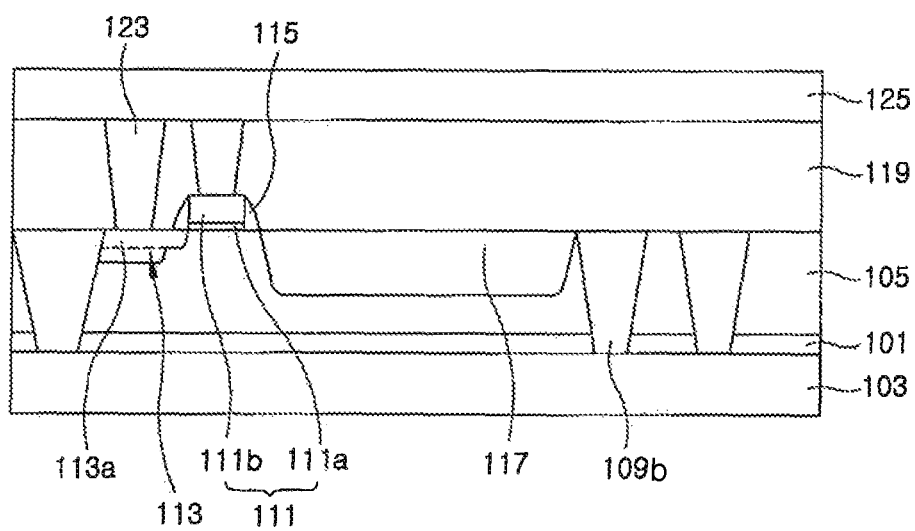

As illustrated in example FIG. 5, the contact holes 121 may be filled with a conductive material to form contacts 123. In embodiments, examples of the conductive material include a polysilicon film doped with at least one of impurity ions, copper (Cu), platinum (Pt), tungsten (W), aluminum (Al), and an alloy film containing these materials. In embodiments, when tungsten is used as the conductive material, chemical vapor deposition and/or atomic layer deposition may be performed. In embodiments, when aluminum is used as the conductive material, chemical vapor deposition may be performed. In embodiments, when copper is used as the conductive material, electroplating or chemical vapor deposition may be performed.

A support substrate 125 may be stacked on the front side of the semiconductor substrate 103 in which the contact 123 is formed and the support substrate 125 and the semiconductor substrate 103 may be bonded, in accordance with embodiments. In embodiments, as a bonding method, at least one of oxide film-oxide film bonding, oxide film-silicon bonding, oxide film-metal film bonding, oxide film-adhesive member-oxide film bonding, and/or oxide film-adhesive member-silicon bonding may be used.

In embodiments, the backside of the semiconductor substrate 103 bonded to the support substrate 125 may be ground to a prescribed thickness and backside thinning may be performed to etch the ground semiconductor substrate 103 using a hydrogen fluoride (HF)-based chemical with the buried insulating layer 101 as an etching stop point. In embodiments, spin etching may be performed using a chemical in which a hydrogen fluoride and an ammonium fluoride are mixed. During backside grinding, the second type device isolation layers 109b may be formed to pass through the epitaxial layer 105 and may be used as an alignment key.

A conductive material for another pad may be formed on the exposed semiconductor substrate 103. In embodiments, examples of the conductive material include metal and a mixed film in which at least two kinds of metal are mixed. In embodiments, a process for forming a color filter and a micro-lens may be selectively performed. In embodiments, a protective film may be formed on the semiconductor substrate 103 and a color filter may be formed on the protective film corresponding to the photodiode 117. A lower planarization film may be formed on the protective film before forming the color filter. An upper planarization film may be formed to cover the color filter and a micro-lens may be formed on the upper planarization film to correspond to the color filter. A low-temperature oxide film may be formed on the protective film including the micro-lens. In embodiments, packing may be performed to package the semiconductor substrate 103 and the support substrate 125. In embodiments, packing may include wire bonding and sawing. Wire bonding may be performed by connecting a pad and an external chip through wires.

While embodiments have been shown and described, embodiments are not limited thereto. It will be understood by those skilled in the art that various changes and modifications may be made without departing from the scope of embodiments as defined in the following claims.

What is claimed is:

1. An apparatus comprising:
    at least one device isolation layer passing through an epitaxial layer in a semiconductor substrate;
    a light-receiving element in each pixel region;
    a transistor in an active region of the semiconductor substrate, partitioned by the device isolation layer; and
    a buried insulating layer below the epitaxial layer in the semiconductor substrate.

2. The apparatus of claim 1, wherein the apparatus is an image sensor.

3. The apparatus of claim 1, wherein the device isolation layer passes through the buried insulating layer.

4. The apparatus of claim 1, wherein all of the device isolation layers pass through the epitaxial layer.

5. The apparatus of claim 1, wherein the device isolation layer comprises:
    a first type device isolation layer formed by filling a first type trench with an insulating material, wherein the first type trench is formed by removing the epitaxial layer to a predetermined depth; and
    a second type device isolation layer formed by filling a second type trench with an insulating material, where the second type trench is formed by removing the epitaxial layer to pass through the epitaxial layer.

6. The apparatus of claim 3, wherein the buried insulating layer is in the semiconductor substrate.

7. The apparatus of claim 6, wherein all of the device isolation layers pass through the epitaxial layer.

8. The apparatus of claim 1, wherein the device isolation layer comprises:
    a first type device isolation layer in a first type trench to a predetermined depth in the epitaxial layer; and a second type device isolation layer in a second type trench that passes through the epitaxial layer.

9. The apparatus of claim 8, wherein the first and second type device isolation layers comprise an insulating material.

10. The apparatus of claim 1, wherein the epitaxial layer comprises silicon.

11. The apparatus of claim 1, wherein the buried insulating layer comprises a silicon oxide.

12. The apparatus of claim 11, wherein the buried insulating layer is $SiO_2$.

13. The apparatus of claim 1, wherein the transistor comprises a gate insulating film and a gate conductive film on the gate insulating film.

14. The apparatus of claim 13, wherein the transistor further comprises lightly-doped drain regions at sides of the gate insulating film and the gate conductive film, and spacers at sidewalls of the gate insulating film and the gate conductive film.

15. The apparatus of claim 13, further comprising an insulating interlayer covering the semiconductor substrate and the gate conductive film, and conductive contacts in the insulating interlayer.

16. The apparatus of claim 15, further comprising a support substrate on the conductive contacts and the insulating interlayer.

17. The apparatus of claim 16, wherein the buried insulating layer is exposed on an underside of the semiconductor substrate.

18. The apparatus of claim 17, wherein the device isolation layer is exposed on the underside of the semiconductor substrate.

19. The apparatus of claim 15, further comprising a color filter and a microlens.

20. The apparatus of claim 19, further comprising a planarization layer, wherein the planarization layer covers the color filter, and the microlens is on the planarization layer and corresponds to the color filter.

* * * * *